(12) United States Patent
Bawden et al.

(10) Patent No.: US 9,177,418 B1
(45) Date of Patent: Nov. 3, 2015

(54) SYSTEM AND METHOD FOR CONVERTING COMPUTER AIDED DESIGN DATA INTO A THREE DIMENSIONAL MODEL

(71) Applicant: LOCKHEED MARTIN CORPORATION, Bethesda, MD (US)

(72) Inventors: Scott Brian Bawden, Winter Springs, FL (US); Daniel L. Diehl, Orlando, FL (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 245 days.

(21) Appl. No.: 13/832,441

(22) Filed: Mar. 15, 2013

(51) Int. Cl.
*G06T 17/00* (2006.01)
*G06T 17/20* (2006.01)

(52) U.S. Cl.
CPC ............... *G06T 17/00* (2013.01); *G06T 17/20* (2013.01)

(58) Field of Classification Search
CPC .............................. G06T 17/00; G06T 17/20
USPC ........................................................ 345/420
See application file for complete search history.

(56) References Cited

U.S. PATENT DOCUMENTS

| | | | |
|---|---|---|---|
| 5,966,133 A * | 10/1999 | Hoppe | 345/420 |
| 7,620,527 B1 * | 11/2009 | Gielis | 703/2 |
| 7,714,860 B2 | 5/2010 | Trotta et al. | |
| 8,155,943 B2 | 4/2012 | Nasle | |
| 8,274,943 B2 | 9/2012 | Yang et al. | |
| 2003/0107572 A1 * | 6/2003 | Smith et al. | 345/428 |
| 2004/0177085 A1 * | 9/2004 | Rappaport et al. | 707/101 |
| 2006/0092156 A1 * | 5/2006 | Trotta et al. | 345/420 |
| 2007/0176924 A1 * | 8/2007 | Uraki | 345/423 |
| 2010/0179788 A1 * | 7/2010 | Santina et al. | 703/1 |
| 2011/0218776 A1 * | 9/2011 | Shono et al. | 703/1 |
| 2012/0133667 A1 | 5/2012 | Lachoff | |
| 2013/0187916 A1 * | 7/2013 | Toy et al. | 345/420 |

* cited by examiner

*Primary Examiner* — Devona Faulk
*Assistant Examiner* — Hai Tao Sun
(74) *Attorney, Agent, or Firm* — Terry M. Sanks, Esq.; Beusse Wolter Sanks & Maire, PLLC

(57) ABSTRACT

A system and method for converting data generated in a computer aided design software component to an alternate, smaller format usable by a variety of alternate software components is provided. CAD data from a project having a plurality of objects is provided. Objects are identified and grouped into object data layers for processing, conversion and 3D model generation. The selected, grouped objects are processed by removing unnecessary data and redundancies, converted to an alternate format, transported to the alternate software component and regenerated by the alternate software component in its own environment.

14 Claims, 7 Drawing Sheets

SYSTEM AND METHOD FOR CONVERTING COMPUTER AIDED DESIGN DATA INTO A THREE DIMENSIONAL MODEL

FIELD OF DISCLOSURE

The present disclosure generally relates to systems and methods for converting computer aided design ("CAD") data into three-dimensional ("3D") modeling data, and more specifically, to systems and methods for converting CAD data files into an alternative, smaller format to permit the production of technically accurate 3D models for use with simulated training systems.

BACKGROUND

Computer aided design ("CAD") programs are powerful design tools used in many industries to research and design three-dimensional objects and structures on a computer with nearly infinite precision and accuracy. Common CAD programs include AutoCAD owned by Autodesk, Inc. and Pro/ENGINEER owned by Parametric Technology Corporation. Common three-dimensional ("3D") modeling applications or engines include 3DS Max owned by Autodesk, Inc. and Solid Works owned by Dassault Systemes SolidWorks Corp. Typically, these programs allow a user/modeler to generate a 3D model in a layer by layer format with each layer composed of multiple data components. Among the many functions these programs and applications offer, at any point during the design of the model, the user is given the ability to manipulate, scale and rotate the entire model or particular layers or individual parts as necessary. Users are also given the option to utilize various modeling techniques such as: polygon modeling, non-uniform rational B-Spline ("NURBS") modeling or Surface tool/editable patch object.

In order to develop 3D models and computer-based virtual worlds using a polygon type modeling technique, CAD data must first be converted to an appropriate model format. This process requires taking CAD data files that can be extremely complex and large (because they contain all the information about materials, products and processes involved in design) and reducing them in size so they can be imported into a 3D model engine and processed such that a 3D model (which only needs information about object exterior surfaces) may be generated or rendered.

Conventionally, the process of identifying the object data required for 3D model generation was done manually by the user. More specifically, a user converted CAD data files as batches, processing each object without any categorization. Disadvantageously, this conventional method requires a unique modeling process for each object in the CAD data file and significant efforts to place and orient each object within the 3D model. Such conventional methods also incur problems in cost and schedule because of the labor required to convert CAD data files for modeling and gaming. Additionally, increased costs are incurred because computers with advanced hardware (e.g., more memory and processing power) are needed to process the large amounts of CAD data.

SUMMARY OF THE DISCLOSURE

The present disclosure is designed to provide a low cost and efficient solution to converting Computer Aided Design ("CAD") data files into formats operable for use in three-dimensional ("3D") modeling. In example embodiments, the present disclosure relates to computer implemented systems and methods for converting CAD data files into file formats capable of being converted into 3D models without the necessity of advanced hardware devices or software. In example embodiments, the present disclosure relates to computer implemented systems and methods for converting CAD data files into file formats capable of being converted into 3D models without the necessity of significant human intervention or labor. In one example embodiment, the computer implemented systems and methods of the disclosure herein are useful in the generation of simulation models used in the training of military personnel.

An example embodiment of the present disclosure includes a computer implemented system and method to convert CAD data files into a file format operable for use in the generation of a 3D simulation model. The system and method generally includes providing CAD data files and dividing or breaking the CAD data into discrete data set blocks before attempting to produce a 3D model. In example embodiments, the CAD data is broken into data blocks by groups of data layers, usually based on location. Thereafter, unnecessary data layers containing information irrelevant to 3D modeling are removed and the remaining data blocks are imported into a 3D modeling engine.

Once imported into the modeling engine, the amount of data is further reduced in the remaining data layers by identifying and grouping like object types together into a single object data layer. Each object data layer is then processed by extracting or removing unnecessary or redundant data. Subsequent to removing the unnecessary or redundant data from the object data layer, redundant instances of like objects are replaced with location tags and a single object. Thereafter, a library is built of common objects, surfaces and textures and stored in an accessible database. Once the redundant instances are replaced, a polygon count is determined. If the polygon count exceeds a predefined limit, then the processed object data layers are further divided into smaller data sets. Thereafter, the processed object data layers are determined to be in either 2D or 3D data format. If the data format is 2D, then it is translated into 3D data format via a translator module. Thereafter, a 3D model is rendered and an output document, if desired, is generated.

Another example embodiment of the disclosure includes a system for converting CAD data into a file format useful for the generation of a 3D model. The system may generally include a computer which operates a CAD software application, a second computer which operates a 3D modeling software application and the computers being in signal communication with each other or linked together via a network. In an alternate example embodiment, the CAD software application and the 3D modeling software application may reside on and be operated by the same computer. In example embodiments, the computer operating the CAD software and 3D modeling applications may include: one or more general or special purpose processors capable of processing data or executable code, a memory or storage media coupled to the processor via a communications bus, an operating system ("OS") resident on the memory that enables operation of software on a hardware platform, a graphical user interface ("GUI") module coupled to a display device and in signal communication with the processor, a computer program or instructions executable by the processor and stored on the memory, a database communicably linked to the computer, one or more network interfaces providing access to a network, and peripheral devices such as a keyboard, a printer or a mobile device Another example embodiment includes program storage device or processor readable by a computer, the device embodying a program or instructions executable by the computer to perform the above described method.

Additional features and advantages of the disclosure will be set forth in the detailed description which follows, and in part will be readily apparent to those skilled in the art from that description or recognized by practicing the disclosure as described herein, including the detailed description which follows, the claims, as well as the appended drawings.

It is to be understood that both the foregoing general description and the following detailed description present example embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the detailed description, serve to explain the principles and operations thereof.

BRIEF DESCRIPTION OF THE DRAWINGS

The present subject matter may take form in various components and arrangements of components, and in various steps and arrangements of steps. The appended drawings are only for purposes of illustrating example embodiments and are not to be construed as limiting the subject matter.

DETAILED DESCRIPTION

Figure 1:
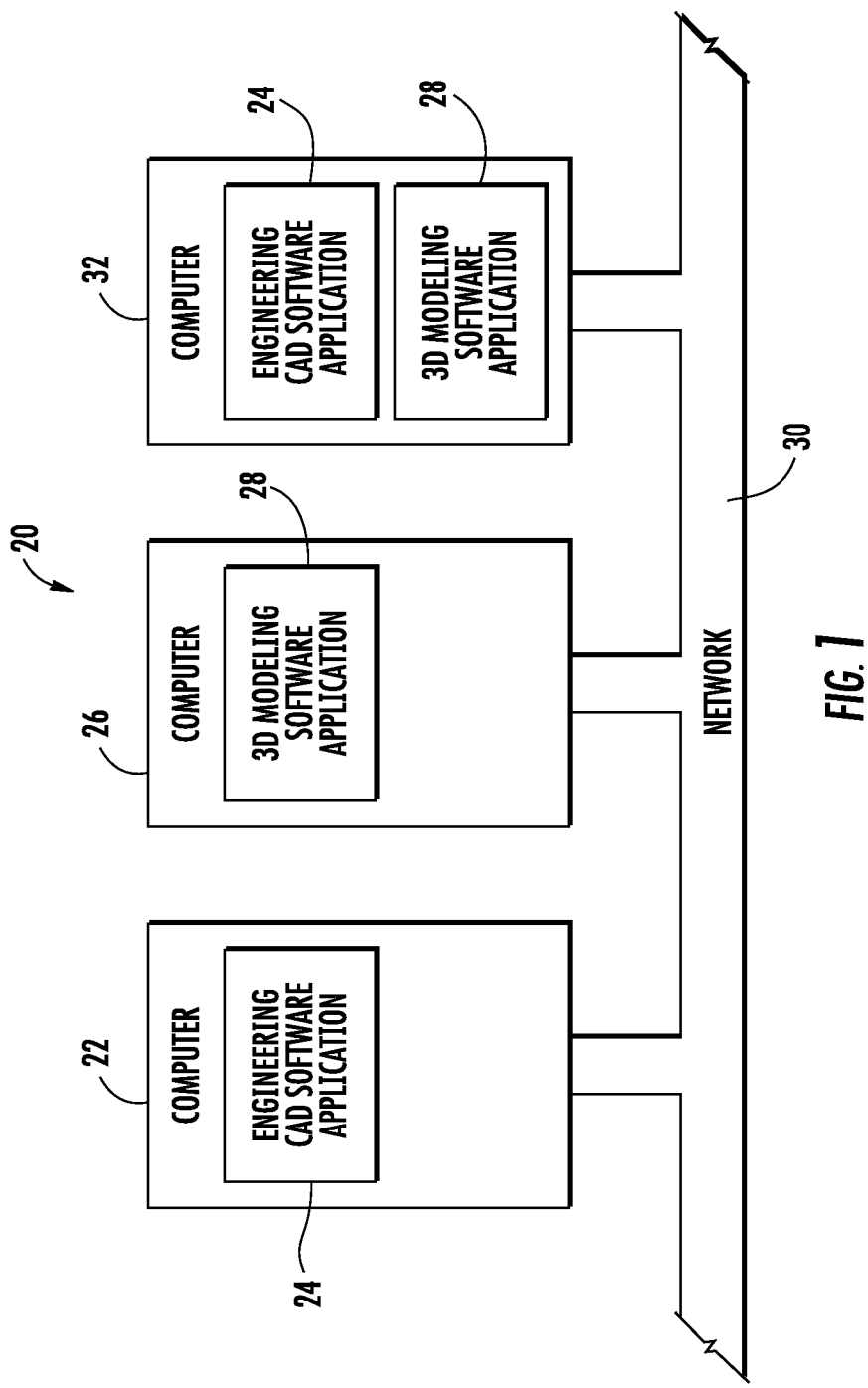
FIG. 1 is a schematic diagram of a computing system environment for use in implementing the conversion of CAD data to 3D modeling data such that a 3D model can be generated according to one example embodiment of the present disclosure.

The present disclosure will now be described more fully hereinafter with reference to the accompanying drawings in which example embodiments of the disclosure are shown. However, this disclosure may be embodied in many different forms and should not be construed as limited to the embodiments set forth herein. These example embodiments are provided so that this disclosure will be both thorough and complete, and will fully convey the scope of the disclosure to those skilled in the art. Like reference numbers refer to like elements throughout the various drawings. Further, as used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

Exemplary embodiments presented herein disclose systems and methods for a computer implemented importation and conversion of Computer Aided Design ("CAD") data sets into three dimensional ("3D") file formats operable for use with generating 3D models used in simulated training events. Advantageously, the disclosed systems and methods reduce the need for advanced hardware and large memories and processors by providing an improved process of data compilation and processing. Further, the disclosed systems and methods reduce the amount of human intervention needed in converting CAD data into a 3D model by providing a grouping technique which identifies unique object types and models them once and thereafter stores them in a library or database for subsequent retrieval and replication. A user may then mark the location of every instance of the object type and the modeling engine may automatically render the object to all locations. In all exemplary embodiments, a computer implemented system and method is provided, wherein CAD data is divided into groups of data layers having like objects. The grouped data layers are processed by having unnecessary and redundant data removed therefrom. Thereafter, the processed data layers are used in the generation and rendering of a 3D model of a simulated training environment.

As will be appreciated by one of skill in the art, the embodiments presented herein may be shown as a process, a data processing system, a computer program product and a service for converting CAD data into 3D modeling data and then a 3D model. Accordingly, the embodiments presented herein may take the form of an entirely hardware embodiment, an entirely software embodiment, or an embodiment combining software and hardware aspects. Furthermore, the embodiments presented herein may take the form of a computer program product on a computer-usable storage medium having computer-usable program components embodied in the medium. Any suitable computer readable medium may be utilized including hard disks, CD-ROMs, optical storage devices, a transmission media such as those supporting the Internet or an intranet, or magnetic storage devices.

Computer program source code of the CAD data conversion system and method in accordance with example embodiments described herein may be written MAXScript™, if 3DS Max™ is used as the modeling engine. Alternatively, it may be written in an object-oriented programming language such as C, JAVA, SMALLTALK or C++. Object code of the CAD data conversion system and method may execute entirely on an individual server or client computer, partly on an individual or a backup server or client computer, as a stand-alone software package, partly on the individual or backup server or client computer and partly on a remote server or client computer or entirely on the remote server or client computer. In the latter scenario, the remote server or client computer may be connected to the individual or backup server or client computer through a local area network ("LAN") or a wide area network ("WAN"), or the connection may be made to the remote server or client computer via the Internet using an Internet Service Provider.

The CAD data conversion system and method is described below with reference to flowchart illustrations and/or block diagrams of processes, apparatus (systems), components, and computer program products according to various example embodiments of the disclosure. It will be understood that each block of the flowchart illustrations and/or block diagrams, and combinations of blocks in the flowchart illustrations and/ or block diagrams, can be implemented by computer program instructions. These computer program instructions may be provided as one or more components to a processor of a general purpose computer, special purpose computer, or other programmable data processing apparatus to produce a machine, such that the components, which execute via the processor of the computer or other programmable data processing apparatus, create means for implementing the functions/acts specified in the flowchart and/or block diagram block or blocks.

These computer program components for the CAD data conversion system and method may also be stored in a computer-readable memory that can direct a computer or other programmable data processing apparatus to function in a particular manner, such that the components stored in the computer-readable memory produce an article of manufacture including components which implement the function/act specified in the flowchart and/or block diagram block or blocks. The computer program components may be loaded onto a computer or other programmable data processing apparatus to cause a series of operational steps to be performed on the computer or other programmable apparatus to produce a computer implemented process such that the components which execute on the computer or other programmable apparatus provide steps for implementing the functions/acts specified in the flowchart and/or block diagram block or blocks.

Turning now to FIG. 1, an exemplary computing system environment 20 which is suitable for implementing the present disclosure is illustrated. The illustrated computing system environment is only one possible embodiment of a suitable computing system environment, is provided only by way of an example, and is not intended to suggest any limitation as to the scope of use or functionality of the invention.

The environment 20 includes a computer 22 which operates a CAD software application. A second computer 26 operates a 3D modeling software application. The computers 22, 26 are linked through a communications network 30. In an alternate embodiment, the CAD software application 24 in the 3D modeling software application 28 reside on and are operated by the same computer 32.

Figure 2:
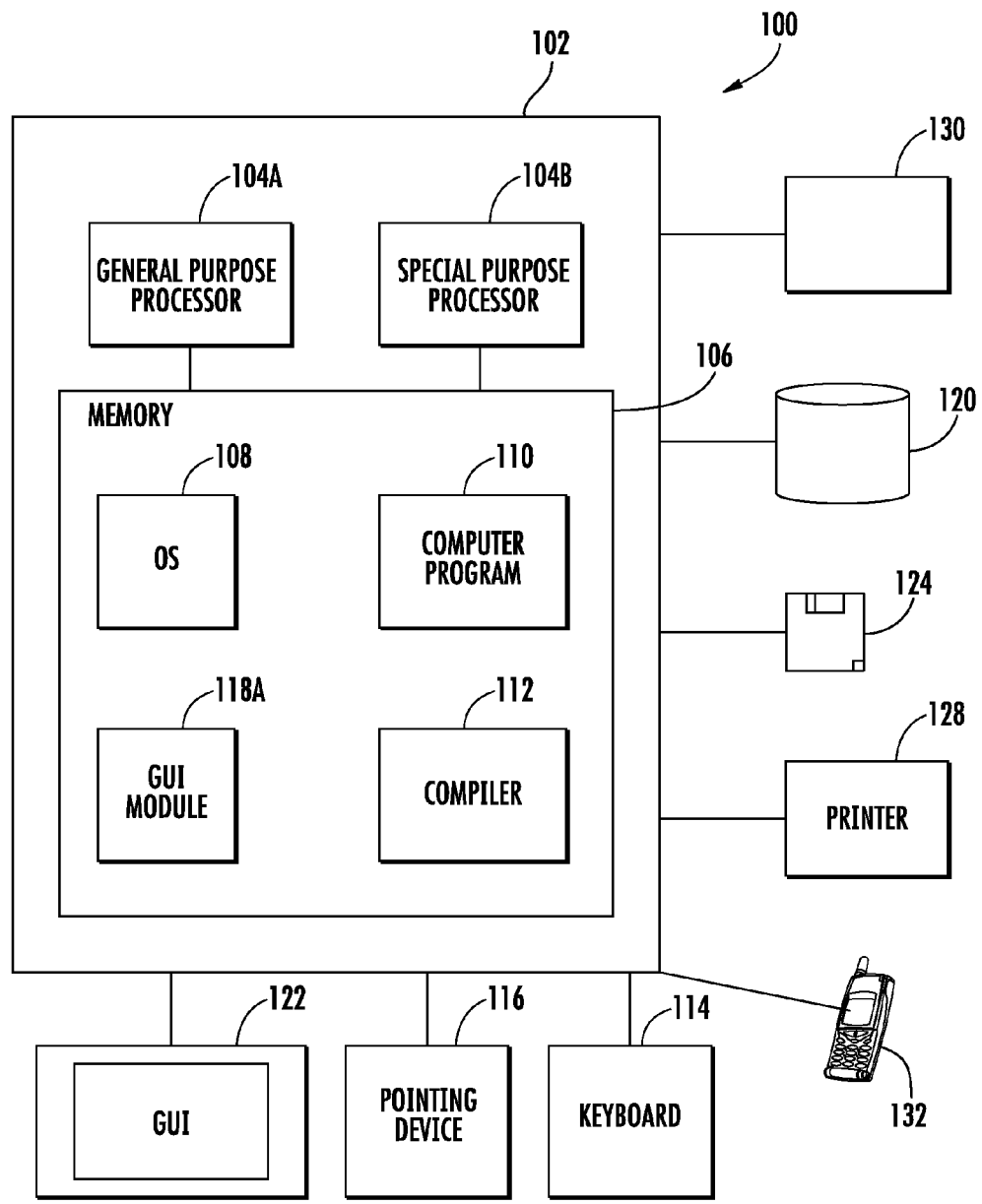
FIG. 2 is a block diagram a hardware and software environment used to implement one or more example embodiments of the present disclosure.

Referring now to FIG. 2, a more detailed and exemplary hardware and software environment 100 used to implement one or more embodiments of the disclosure is provided. The hardware and software environment includes a computer 102 and may include various peripherals. Computer 102 may be a client computer, server computer, or may be a database computer. The computer 102 comprises a general purpose processor 104A and/or a special purpose processor 104B (hereinafter alternatively collectively referred to as processor 104) and a memory 106, such as random access memory (RAM). The computer 102 may be coupled to other devices, including input/output (I/O) devices such as a keyboard 114, a cursor control device 116 (e.g., a mouse, a pointing device, pen and tablet, etc.) and a printer 128. In one or more example embodiments, computer 102 may be coupled to a media viewing/listening device 132 (e.g., an MP3 player, iPod™, Nook™, portable digital video player, cellular device, personal digital assistant, etc.).

In one example embodiment, the computer 102 operates by the general purpose processor 104A performing instructions defined by a computer program component 110 under control of an operating system 108. The computer program 110 and/or the operating system ("OS") 108 may be stored in the memory 106 and may interface with the user and/or other devices to accept input and commands and, based on such input and commands and the instructions defined by the computer program 110 and OS 108 to provide output and results.

Output/results may be presented on the display 122 or provided to another device for presentation or further processing or action. In one example embodiment, the display 122 comprises a liquid crystal display ("LCD") having a plurality of separately addressable liquid crystals. Each liquid crystal of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface ("GUI") module 118A. Although the GUI module 118A is depicted as a separate module, the instructions performing the GUI functions can be resident or distributed in the OS 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of a multi-touch devices include mobile devices (e.g., iPhone™, Nexus™ Android™ devices, etc.), tablet computers (e.g., iPad™, Surface™, Galaxy Tab™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, some or all of the computer program 110 instructions may be implemented via firmware instructions stored in a read only memory ("ROM"), a programmable read only memory ("PROM") or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit ("ASIC").

The computer 102 may also implement a compiler 112 which allows an application program 110 written in a programming language such as COBOL, Pascal, C++, FORTRAN, or other language to be translated into processor 104 readable code. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers 102 across a network. A typical combination of resources may include a network comprising the Internet, LANs (local area networks), WANs (wide area networks), SNA (systems network architecture) networks, or the like, clients that are personal computers or workstations, and servers that are personal computers, workstations, minicomputers, or mainframes (as set forth in FIG. 1). Clients may execute a client application or web browser and communicate with server computers executing web servers. Such a web browser is typically a program such as MICROSOFT INTERNET EXPLORER™, MOZILLA FIREFOX™, OPERA™, APPLE SAFARI™, etc. Further, the software executing on clients may be downloaded from server computer to client computers and installed as a plug in or ACTIVEX™ control of a web browser.

In one example embodiment, instructions implementing the OS 108, the computer program 110, and the compiler 112 are tangibly embodied in a non-transient computer-readable medium, e.g., data storage device 120, which could include one or more fixed or removable data storage devices, such as a zip drive, floppy disc drive 124, hard drive, CD-ROM drive, tape drive, optical drive, etc. Further, the OS 108 and the computer program 110 are comprised of computer program instructions which, when accessed, read and executed by the computer 102, causes the computer 102 to perform the steps necessary to implement and/or use the present disclosure or to load the program of instructions into a memory, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the disclosure. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Figure 3:
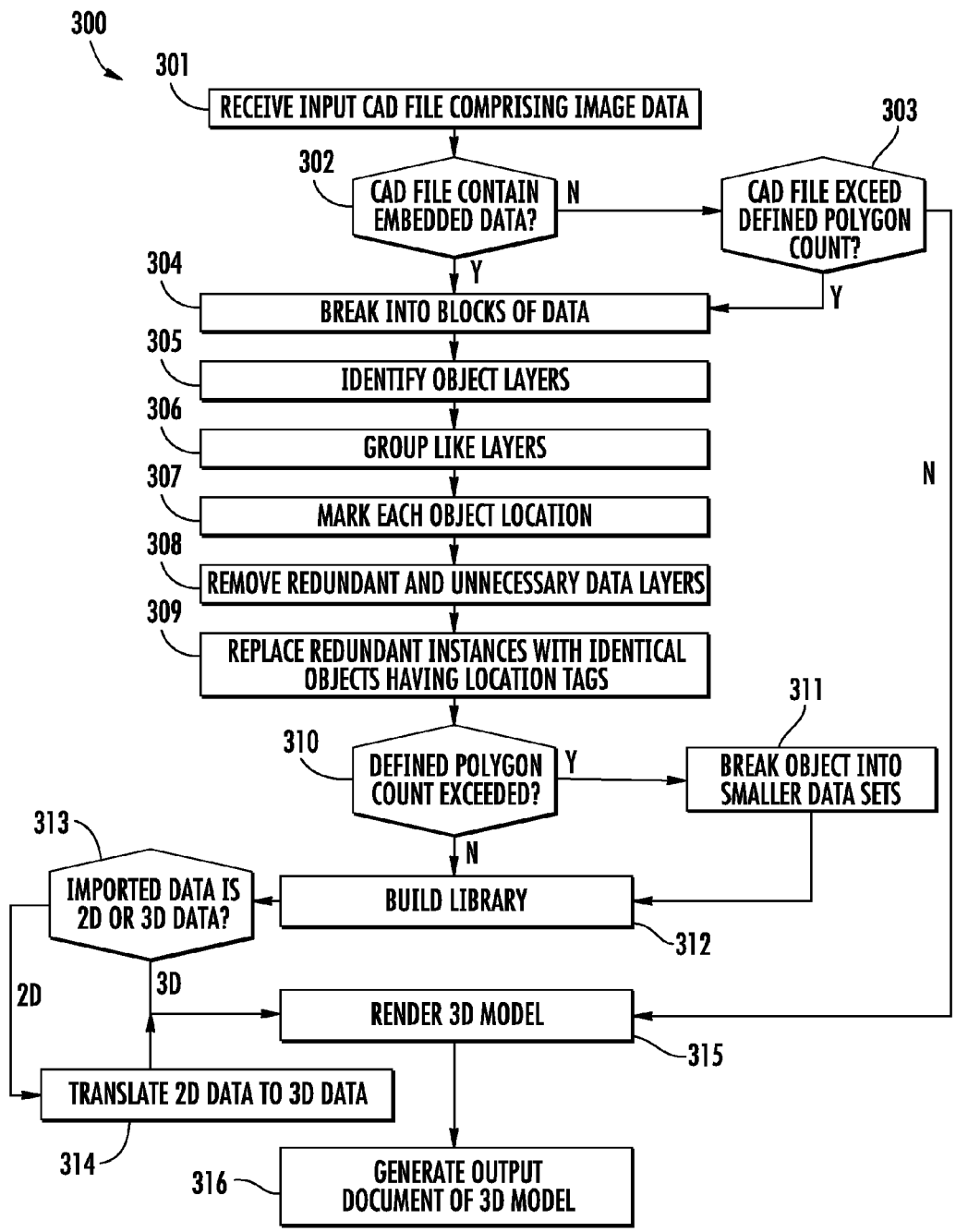
FIG. 3 is a flowchart of an overall example method of converting CAD data to 3D modeling data such that a 3D model can be generated in accordance with an embodiment of the present disclosure.

Referring now to FIG. 3, an overall example embodiment of the present disclosure includes a computer implemented method 300 to convert a first file format (e.g., CAD data files) into a second, smaller file format operable for use in the generation of a 3D simulation model. The method 300 generally includes providing CAD data files at Step 301. At step 302 it is determined if the CAD data contains embedded data. In response to a determination that the CAD data contains embedded data then the operation of Step 304 is performed. Conversely, if it is determined that the CAD data does not contain embedded data then it is determined if the CAD data files exceed a predefined polygon count at Step 303.

If the CAD data does not exceed the predefined polygon count, then a 3D model is rendered in accordance with Step 315. If, however, the CAD exceeds the predefined polygon count, then the CAD data is divided or broken into discrete data blocks before attempting to produce a 3D model in accordance with Step 304. In example embodiments, the CAD data is broken into data blocks by groups of data layers, usually based on location (i.e., entrance, front, back, side, roof, left wing, right wing, fuselage, cockpit, etc.). It will be appreciated by those skilled in the art, that CAD data files typically contain numerous data layers, which are thus capable of being grouped. Thereafter, unnecessary data layers containing information irrelevant to 3D modeling are removed and the remaining data blocks are imported into a 3D modeling engine.

Once imported into the modeling engine, the amount of data is further reduced in the remaining data layers by identifying and grouping like object types together into a single object data layer as set forth in Steps 305 and 306. In example embodiments, one object data layer per object type is created. By way of example only, for a refinery, object type groups may include walls, rails, valves, tanks, fire extinguishers, stacks, fans, etc. Each object data layer is then processed.

Each object data layer is first processed by marking each object location (Step 307) and extracting or removing unnecessary or redundant data (Step 308) (i.e., embedded data or information relating to technical manuals, materials, product specifications, performance data, manufacturer details, web links, reference information, etc.). Subsequent to removing the unnecessary or redundant data from the object data layer in accordance with Step 308, redundant instances of identical objects are replaced with location tags and a single object as shown in Step 309. Thereafter, the polygon count is again determined and compared to a predefined limit at Step 310. If the polygon count exceeds the predefined limit, then the processed object data layers are further divided into smaller data sets (Step 311). If the polygon count does not exceed the predefined limit, then a library is built of common objects, surfaces and textures and stored in an accessible database (Step 312). In example embodiments, the 3D modeling engine will parse incoming object layers for location tags and automatically render and place pre-made objects from the library or database in place of those tag locations.

Once the library is built (Step 312), the processed object data layers are determined to be in either 2D or 3D data format (313). In response to a determination that the object data layer is in a 2D data format, then it is translated into 3D data format via a translator module as show in Step 314. Thereafter, a 3D model is rendered (Step 315) and an output document, if desired, is generated (Step 316).

Figure 4:
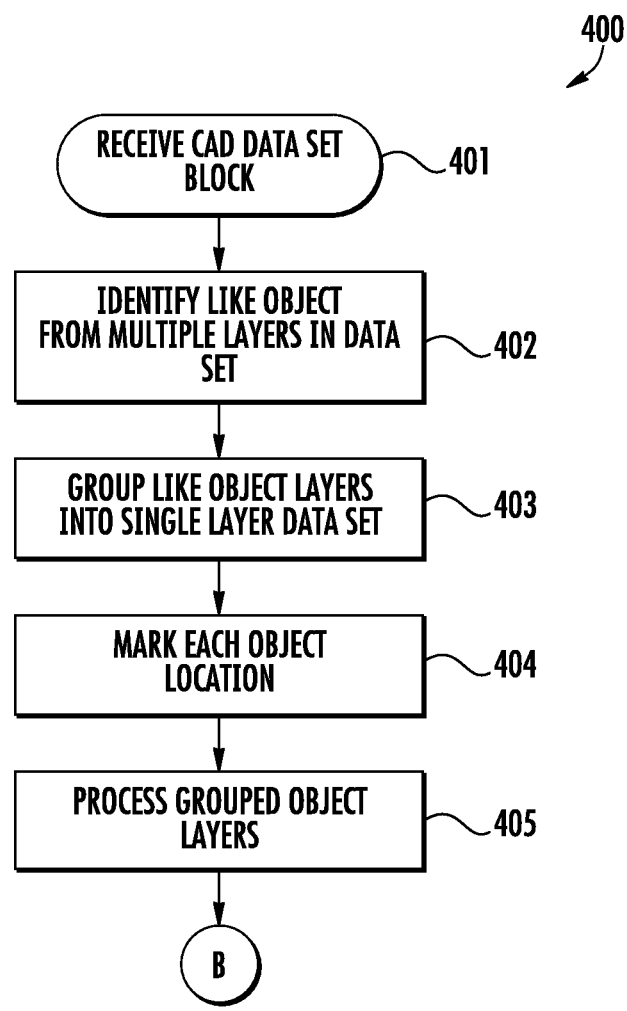
FIG. 4 is a flowchart of an example method of reducing data layers in accordance with an embodiment of the present disclosure.

Referring now to FIG. 4, an example embodiment of a method 400 of reducing data layers in accordance with the present disclosure is shown. As shown, CAD data set blocks are imported from a CAD software component into a 3D modeling software component (Step 401). In example embodiments, the CAD data set blocks are grouped data layers of a CAD design. In example embodiments, the data layers are grouped based on location, however, it will be appreciated by those skilled in the art that other suitable methods of grouping may be utilized. At Step 402, the CAD data set blocks are mined for like objects. Once like objects are located, they are combined and saved into a single object data layer set file (Step 403). By way of non-limiting example, for a housing structure, all data relating to walls would be grouped together and saved as one "wall" data layer file within a library. Once the single object data layer set is created, locations of each objects are marked by adding a node or tag (Step 404). Thereafter, the grouped object data layers are processed according to the methods of the present disclosure (Step 405), FIG. 5.

Figure 5:
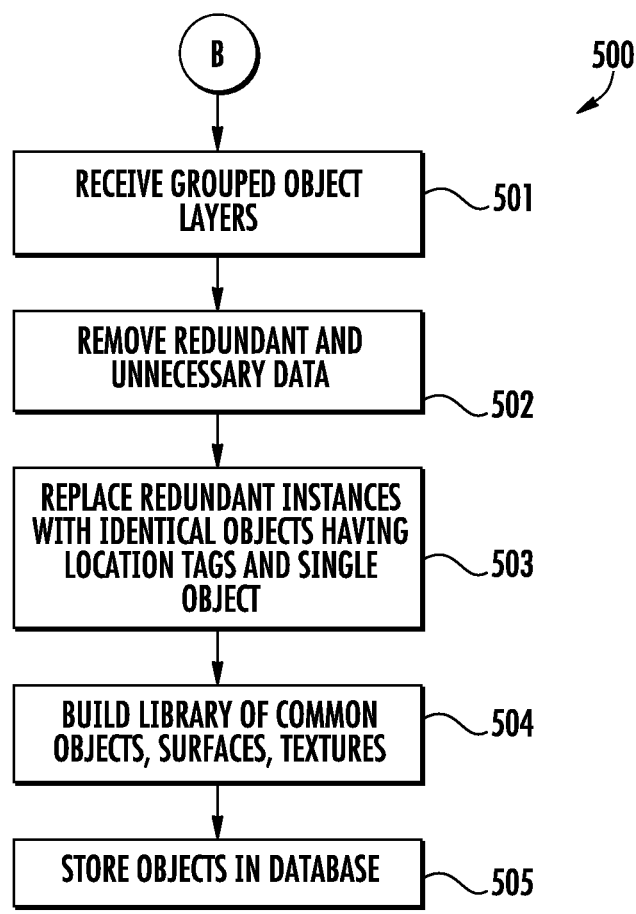
FIG. 5 is a flowchart of an example method of processing data layers in accordance with an embodiment of the present disclosure.

Referring now to FIG. 5, an example method 500 of processing data layers in accordance with an embodiment of the present disclosure is shown. As shown, the grouped object data layers are provided at Step 501. Once provided and received, unnecessary and redundant information is extracted and removed (Step 502). It will be appreciated by those skilled in the art that oftentimes CAD data sets contain voluminous amounts of information relating to various objects (i.e., embedded data or information relating to technical manuals, materials, product specifications, performance data, manufacturer details, web links, reference information, etc.). The majority of this information is not required or needed for the generation of a 3D model, which uses information relating to the exterior surfaces and textures of objects. By removing this extraneous data, the overall file size becomes smaller and easier to process. Thus, the use of advanced hardware and software components is eliminated. By removing redundant object data the overall file size can be further decreased.

Figure 5A:
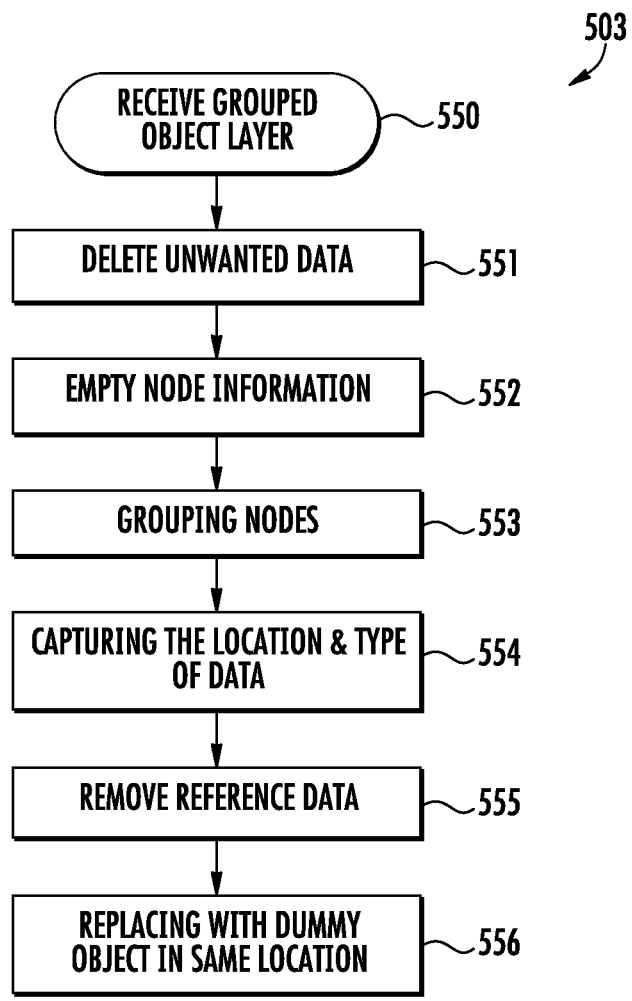
FIG. 5A is a flowchart of an example method of replacing redundant instances within data layers in accordance with an embodiment of the present disclosure.

Upon completing Step 502, redundant instances are replaced (Step 503). Referring now to FIG. 5A, an example method 503 of replacing redundant instances in accordance with an embodiment of the present disclosure is shown. As shown, as a first operation unwanted data may be deleted (Step 551), existing node information may be emptied (Step 552), remaining nodes may be grouped together (Step 553). Thereafter, the location and type of data may be captured (Step 554) and reference data may be removed (Step 555). After removing reference data in (Step 555), the redundant instances are replaced with "dummy objects" or location tags in (Step 556). In example embodiments, each of the foregoing operations or steps may be performed via programming instructions written MAXScript™, if 3DS Max™ is used as the modeling engine.

Referring back to FIG. 5, at Step 504 a library of common objects, surfaces and textures is built. Once built, the library is stored in an accessible database (Step 505) for retrieval and population throughout the 3D model. Advantageously, by processing the object data layers and replacing redundant instances of like objects, the modeling engine may mine the processed objects data layers for location tags and generate or populate pre-made objects retrieved from the library in the appropriate place during a rendering operation.

Figure 6:
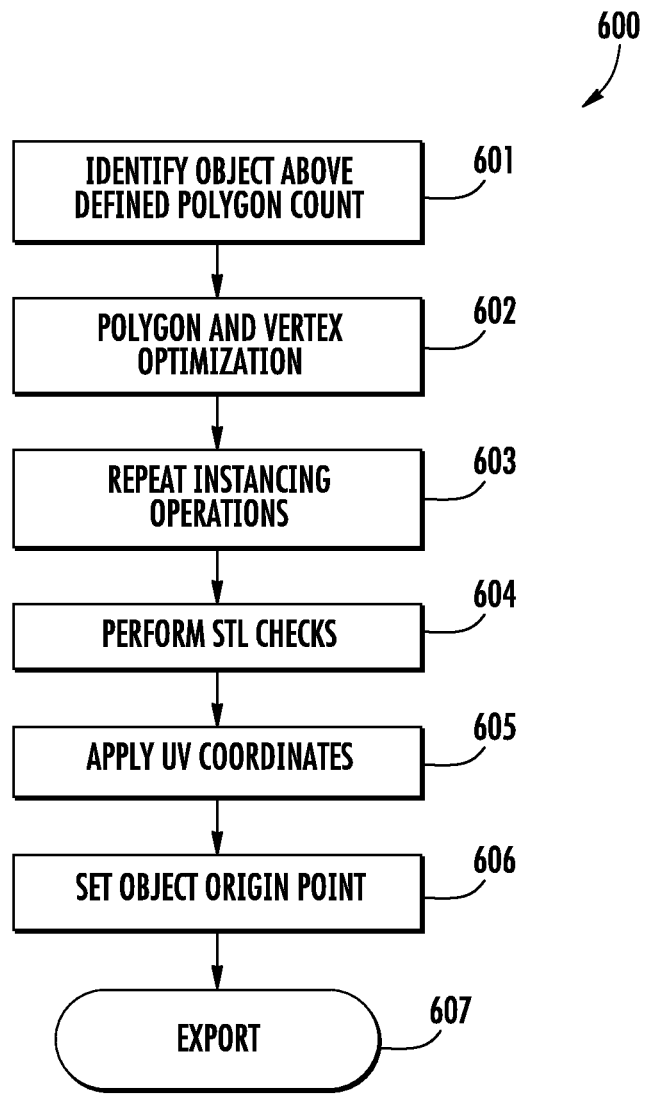
FIG. 6 is a flowchart of an example method of further reducing the polygon count of data layers in accordance with an embodiment of the present disclosure.

Referring now to FIG. 6, an example method of 600 of reducing the polygon count of certain data layers in accordance with the present disclosure is shown. As shown, a determination is made as to whether the polygon count of the processed object data layer exceeds a predefined limit (Step 601). In response to a determination that the polygon count is exceeded a series of operations may be performed to minimize the polygon count. At Step 602, polygons and vertices are optimized. In addition, smoothing functions are performed to remove redundant object information. At Step 603, the above-described instancing operations may be repeated to ensure that all such redundant instances have been replaced. Stereo lithography ("STL") checks may be performed on all objects to validate each objects structure before a rendering operation (Step 604). UV coordinates and textures may be applied to each object (Step 605). It will be appreciated by those skilled in the art that the letters "U" and "V" denote the axes of the 20 texture because "X", "Y" and "Z" are already used to denote the axes of the 30 object in model space. At Step 606, each objects origin point may be set to a specified point in space that will allow each object to fit together, similar to puzzle pieces, when they are exported for rendering. At step 607, each object may be exported with the embedded information for rendering.

Advantageously, by utilizing the foregoing system and method, the workload of generating a 3D model from CAD data files is driven by the number of unique objects within the data file as opposed to the number of objects in the data file. Put another way, by identifying, grouping and replacing redundant instances, the present disclosure can eliminate the need for significant user intervention and advanced hardware because a majority of redundant data is removed and not utilized in the rendering process.

The embodiments described above provide advantages over conventional devices and associated systems and methods. It will be apparent to those skilled in the art that various modifications and variations can be made to the present disclosure without departing from the spirit and scope of the disclosure. Thus, it is intended that the present disclosure cover the modifications and variations of this disclosure provided they come within the scope of the appended claims and their equivalents. Furthermore, the foregoing description of the disclosure and best mode for practicing the disclosure are provided for the purpose of illustration only and not for the purpose of limitation—the disclosure being defined by the claims.

What is claimed is:

1. A non-transitory, tangible computer-readable medium having computer-executable instructions embodied thereon that, when executed, cause a computing device to perform a method of utilizing computer aided design (CAD) data to generate a three-dimensional (3D) model, the method comprising:
   obtaining the CAD data in a first electronic format from a computer aided design software component, wherein the CAD data defines a plurality of objects;
   dividing the CAD data is based on location;
   importing the divided CAD data into a 3D modeling software component;
   converting the CAD data associated with the plurality of objects to corresponding 3D modeling data in a second electronic format via a computing device, wherein the converting step is performed by the steps of:
   grouping like objects together from the plurality of objects into at least one object data layer;
   processing the at least one object data layer by removing unnecessary and redundant data associated with the plurality of objects and replacing redundant instances of the plurality of objects with identical objects having location tags and a single object to create a reduced data set;
   determining if a polygon count of the reduced data set exceeds a predefined polygon count;
   if the polygon count exceeds the predefined polygon count, reducing the polygon count of the reduced data set;
   building a library of common objects of the reduced data set and storing the library on an accessible database when the reduced data set does not exceed the predefined polygon count; and
   exporting the processed, at least one object data layer for rendering; and
   rendering and generating, for display on a display device of a simulation system, a 3D model having the plurality of objects from the processed, at least one object layer data and the library in the 3D modeling software component,
   wherein the step of reducing the polygon count includes:
   optimizing the polygons and vertices;
   repeating the instancing replacement step to ensure that all redundant instances were replaced;
   performing stereo lithography (STL) checks to validate each objects structure before a rendering;
   applying two-dimensional axis coordinates and textures; and
   embedding and setting each objects origin point to a specified point in space that will allow each object to fit together after exportation for rendering.

2. The medium of claim 1, wherein corresponding 3D modeling data is readable by the 3D modeling software component.

3. The medium of claim 1, wherein the plurality of objects comprises one or more of an object, a structure, a texture, a color, a partial structure, or a surface.

4. The medium of claim 1, wherein the unnecessary data comprises embedded data relating to one or more of technical manuals, materials, product specifications, performance data, manufacturer details, web links, or reference information.

5. The medium of claim 1, wherein the step of processing the at least one object data layer further includes the step of determining whether the at least one object data layer is in a 2D data format; and in response to determining that the at least one object data layer is in a 2D file format, translating the at least one object data layer into a 3D data format.

6. The medium of claim 5, wherein the translating of the at least one object data layer is performed via a translator resident on the computing device.

7. A computer-implemented method, comprising:
receiving input computer aided design (CAD) data in a first electronic format representing a plurality of objects;
determining whether the CAD data exceeds a predefined polygon count;
in response to determining that the CAD data exceeds the predefined polygon count dividing the CAD data based on location into at least one CAD data layer;
importing the at least one CAD data layer into a three-dimensional (3D) modeling engine;
converting the CAD data associated with the plurality of objects to corresponding 3D modeling data in a second electronic format via a computing device, wherein the converting step is performed by the steps of:
grouping like objects together from the plurality of objects into at least one object data layer;
processing the at least one object data layer by removing unnecessary and redundant data associated with the plurality of objects and replacing redundant instances of the plurality of objects with identical objects having location tags and a single object to create a reduced data set;
determining if a polygon count of the reduced data set exceeds the predefined polygon count;
if the polygon count of the reduced data set exceeds the predefined polygon count, reducing the polygon count of the reduced data set;
building a library of common objects and storing the library on an accessible database when the reduced data set does not exceed the predefined polygon count; and
exporting the processed, at least one object data layer for rendering; and
rendering and generating, on a display device, a 3D model having the plurality of objects from the processed, at least one object layer data and the library in the 3D modeling software component,
wherein the step of reducing the polygon count includes:
optimizing the polygons and vertices;
repeating the instancing replacement step to ensure that all redundant instances were replaced;
performing stereo lithography (STL) checks to validate each objects structure before a rendering;
applying two-dimensional (2D) axis coordinates and textures; and
embedding and setting each objects origin point to a specified point in space that will allow each object to fit together after exportation for rendering.

8. The method of claim 7, wherein the plurality of objects comprises one or more of an object, a structure, a texture, a partial structure, or a surface.

9. The method of claim 7, wherein the unnecessary data is embedded data relating to one or more of technical manuals, materials, product specifications, performance data, manufacturer details, web links, or reference information.

10. The method of claim 7, wherein the step of processing the at least one object data layer further includes the step of determining whether the at least one object data layer is in a 2D data format; and in response to determining that the at least one object data layer is in a 2D file format, translating the at least one object data layer into a 3D data format.

11. The method of claim 10, wherein the translating of the at least one object data layer is performed via a translator resident on the computing device.

12. A system the converting computer aided design (CAD) data into a second, smaller data format operable for use in the generation of a three-dimensional (3D) simulation model, comprising:
one or more processors;
a memory coupled to the one or more processors, wherein the memory is configured to store program instructions executable by the one or more processors to implement a three-dimensional (3D) translator configured to:
obtain CAD data in a first electronic format from a computer aided design software component, wherein the CAD data defines a plurality of objects;
divide the CAD data based on location;
import the divided CAD data into a 3D modeling software component;
convert the CAD data associated with the plurality of objects to corresponding 3D modeling data in a second electronic format via a computing device, wherein the instructions executable to implement the 3D translator to convert the CAD data includes instructions configured to:
group like objects together from the plurality of objects into at least one object data layer;
process the at least one object data layer by removing unnecessary and redundant data associated with the plurality of objects and replacing redundant instances of the plurality of objects with identical objects having location tags and a single object to create a reduced data set;
determine if a polygon count of the reduced data set exceeds a predefined polygon count;
if the polygon count exceeds the predefined polygon count, reduce the polygon count of the reduced data set;
build a library of common objects of the reduced data set and store the library on an accessible database when the reduced data set does not exceed the predefined polygon count; and
export the processed, at least one object data layer for rendering; and
render and generate, on a display device, a three-dimensional model having the plurality of objects from the processed, at least one object layer data and the library in the 3D modeling software component,
wherein the step of reducing the polygon count includes:
optimizing the polygons and vertices;
repeating the instancing replacement step to ensure that all redundant instances were replaced;
performing stereo lithography (STL) checks to validate each objects structure before a rendering;
applying two-dimensional (2D) axis coordinates and textures; and
embedding and setting each objects origin point to a specified point in space that will allow each object to fit together after exportation for rendering.

13. The system of claim 12, wherein the plurality of objects comprises one or more of an object, a structure, a texture, a color, a partial structure, or a surface.

14. The system of claim 12, wherein the unnecessary data comprises embedded data relating to one or more of technical manuals, materials, product specifications, performance data, manufacturer details, web links, or reference information.

* * * * *